United States Patent
Ho et al.

(10) Patent No.: US 6,743,728 B2
(45) Date of Patent: Jun. 1, 2004

(54) METHOD FOR FORMING SHALLOW TRENCH ISOLATION

(75) Inventors: Tzu En Ho, Ilan (TW); Chang Rong Wu, Banchiau (TW); Tung-Wang Huang, Taipei (TW); Shing-Yih Shih, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 3 days.

(21) Appl. No.: 10/322,224

(22) Filed: Dec. 17, 2002

(65) Prior Publication Data
US 2004/0058549 A1 Mar. 25, 2004

(30) Foreign Application Priority Data
Sep. 23, 2002 (TW) ............................................. 91121724

(51) Int. Cl.[7] .............................................. H01L 21/301
(52) U.S. Cl. ........................ 438/700; 438/435; 438/702
(58) Field of Search ................................ 438/700, 702, 438/706, 723, 745, 435, 436

(56) References Cited
U.S. PATENT DOCUMENTS 6,150,238 A * 11/2000 Wu et al. ................... 438/435
6,337,282 B2 * 1/2002 Kim et al. .................. 438/699
6,531,377 B2 * 3/2003 Knorr et al. ................ 438/435
2003/0224580 A1 * 12/2003 Huang et al. ............... 438/435

* cited by examiner

Primary Examiner—Kin-Chan Chen
(74) Attorney, Agent, or Firm—Merchant & Gould P.C.

(57) ABSTRACT

A method for forming shallow trench isolation. A substrate is provided with a mask layer formed thereon. The mask layer is etched to expose a portion of the substrate, and the portion of the substrate is etched to form a trench. A liner layer is formed on the inside wall of the trench. A first dielectric layer and a sacrificial layer are sequentially deposited on the substrate such that the trench is substantially filled, wherein the first dielectric layer is formed by high density plasma chemical vapor deposition (HDPCVD). Portions of the first dielectric layer and the sacrificial layer are removed from the trench. A second dielectric layer is deposited on the substrate such that the trench is substantially filled, wherein the second dielectric layer is formed by high density plasma chemical vapor deposition (HDPCVD). A portion of the second dielectric layer is removed from the trench.

27 Claims, 7 Drawing Sheets

METHOD FOR FORMING SHALLOW TRENCH ISOLATION

BACKGROUND OF THE INVENTION

1. Field of the Invention

The invention relates to a semiconductor process, and more particularly to a shallow trench isolation fabricated process using high density plasma chemical vapor deposition (HDPCVD).

2. Description of the Related Art

Recently, as the manufacturing techniques of semiconductor integrated circuits develop, the number of elements in a chip increase. The size of the element decreases as the degree of integration increases. The line width used in manufacturing lines has decreased from sub-micron to quarter-micron, or even to a smaller size. However regardless of the reduction of the size of the element, adequate insulation or isolation must be formed among individual elements in the chip so that good element characteristics can be achieved. This technique is called device isolation technology. The main object is to form an isolation region, and reduce the size of the isolation as much as possible while assuring good isolation to provide more space for additional elements.

Among different element isolation techniques, LOCOS and shallow trench isolation region manufacturing methods are the two used most. In particular, as the latter has a small isolation region and can keep the substrate level after the process is finished, it is the semiconductor manufacturing method obtaining the most attention. In the conventional shallow trench isolating method, a dielectric layer is formed in the trench within the substrate using a chemical vapor deposition (CVD) Afterwards, the excess portion of the dielectric layer over the substrate is removed by etching or chemical mechanical polishing (CMP). Thereby a shallow trench isolation is formed. However, due to that scaled down density and dimensions of integrated circuits (ICs), i.e., 0.11 micron or deeper, the dielectric layer cannot easily fill the entire trench, thereby decreasing the efficiency of the element isolation.

As a result of filling the entire trench which has a high aspect ratio, recently, a high-density plasma chemical vapor deposition (HDPCVD) is used to form a dielectric layer on the substrate instead of chemical vapor deposition (CVD). In a HDPCVD, the dielectric layer is deposited using O2 and SiH4 gases.

FIGS. 1A~1C show a conventional fabrication process of a shallow trench isolation. In FIG. 1A, a pad oxide layer 12 is deposited on a substrate 10 such as Si substrate, wherein the thickness of the pad oxide layer 12 is about 50~200 Å. The pad oxide layer 12 is formed using thermal oxidation or chemical vapor deposition (CVD). Thereafter, a silicon nitride layer 14 is deposited on the pad oxide layer 12 using CVD, and the thickness of the silicon oxide layer 14 is 500~2000 Å. A mask layer thereby consists of the pad oxide layer 12 and the silicon nitride layer 14. Next, a pattern is defined on the silicon nitride layer 14 and the pad oxide layer using photolithography and etching techniques to expose a portion of the substrate 10 where the shallow trench isolation is formed.

Next, In FIG. 1B, the exposed portion of the substrate is etched to form a trench 15, and the depth of the trench 15 is about 3500~5000 Å. Then, a thin liner layer 16 is formed on the sidewall of the trench 15 using thermal oxidation process, and the thickness of the liner layer 16 is 180 Å.

As shown in FIG. 1C, in a HDPCVD, a dielectric layer 18 is deposited and fills the trench 15, wherein O2 and SiH4 are reactants.

As shown in FIG. 2, due to that the aspect ratio of the trench 15 being 4 and above, the dielectric layer 18 deposed on the silicon nitride layer 14 may cover the opening of the trench 15 in the high-density plasma chemical vapor deposition (HDPCVD) process, such that the dielectric layer 18 cannot fill the trench 15 completely, and a void is formed in the trench.

SUMMARY OF THE INVENTION

Accordingly, an object of the present invention is to provide a method for fabricating shallow trench isolation to improve dielectric layers in trenches. First, a substrate is provided. A mask layer is formed on the substrate. The mask layer is etched to expose a portion of the substrate, and the portion of the substrate is etched to form a trench. A liner layer is formed on the inside wall of the trench. A first dielectric layer and a sacrificial layer are sequentially deposited on the substrate such that the trench is substantially filled, wherein the first dielectric layer is formed by high density plasma chemical vapor deposition (HDPCVD). A portion of the first dielectric layer is removed from the trench. The sacrificial layer is completely removed, and the aspect ratio of the trench is reduced. A second dielectric layer is deposited on the substrate such that the trench is substantially filled without voids, wherein the second dielectric layer is formed by high density plasma chemical vapor deposition (HDPCVD). A portion of the second dielectric layer is removed from the trench.

Accordingly, another object of the present invention is to provide a method for fabricating shallow trench isolation using a boron-doped phosphosilicate glass (BPSG) layer as a sacrificial layer. During HDPCVD, the sacrificial layer is deposited so that the aspect ratio of the trench is reduced, and the dielectric fills the trench easily, wherein the BPSG layer is deposited by sub-atmospheric pressure chemical vapor deposition (SAPCVD) or atmospheric pressure chemical vapor deposition (APCVD), and the BPSG layer is planarized by a flow process to fill voids in the trench. Because boron-doped phosphosilicate glass is a dielectric material, the BPSG layer can remain in the trench as a portion of the dielectric layer.

According to the present invention, the dielectric layer can be deposited by HDPCVD in the high aspect ratio trench.

DESCRIPTION OF THE DRAWINGS

For a better understanding of the present invention, reference is made to a detailed description to be read in conjunction with the accompanying drawings, in which.

DETAILED DESCRIPTION OF THE INVENTION

FIGS. 3–12 are cross-sections of a method for fabricating shallow trench isolation according to the present invention. The shallow trench isolation is formed on a semiconductor substrate 10, such as a silicon wafer.

Figure 1A:
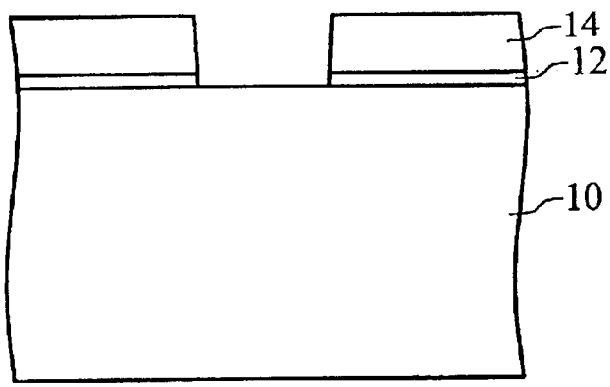
FIGS. 1A to 1C are cross-sections of the conventional method for fabricating shallow trench isolation.
Figure 1B:
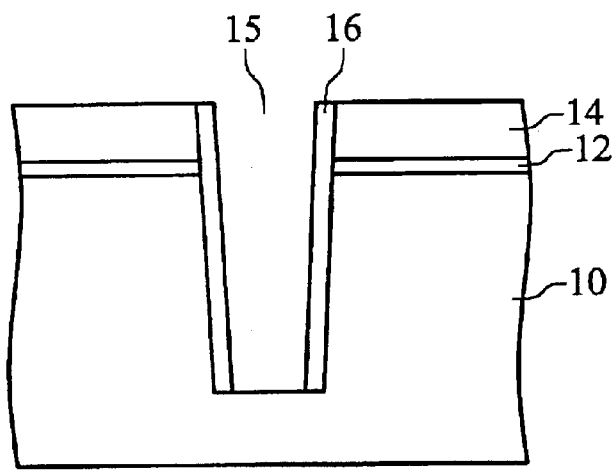
Figure 1C:
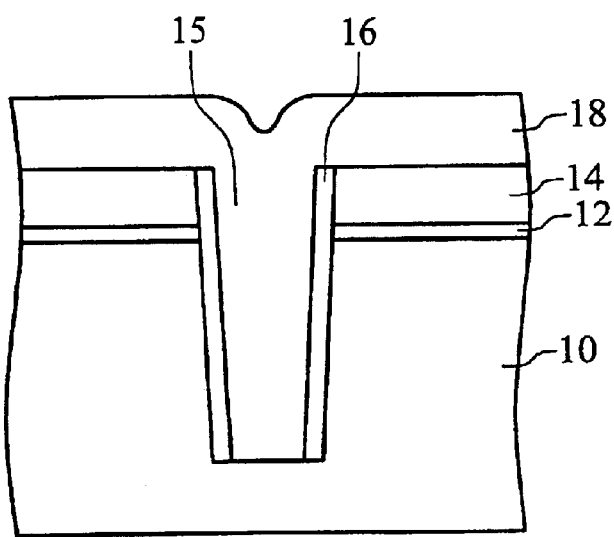
Figure 2:
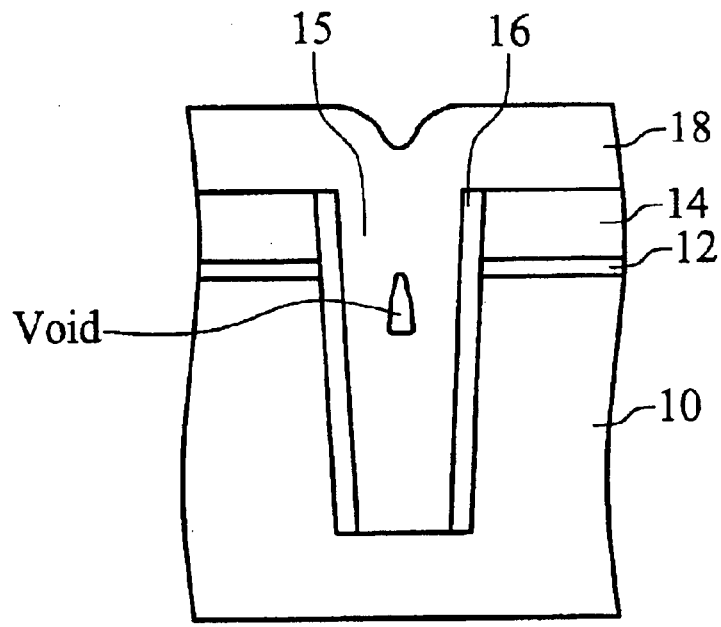
FIG. 2 shows a void in the trench.
Figure 3:
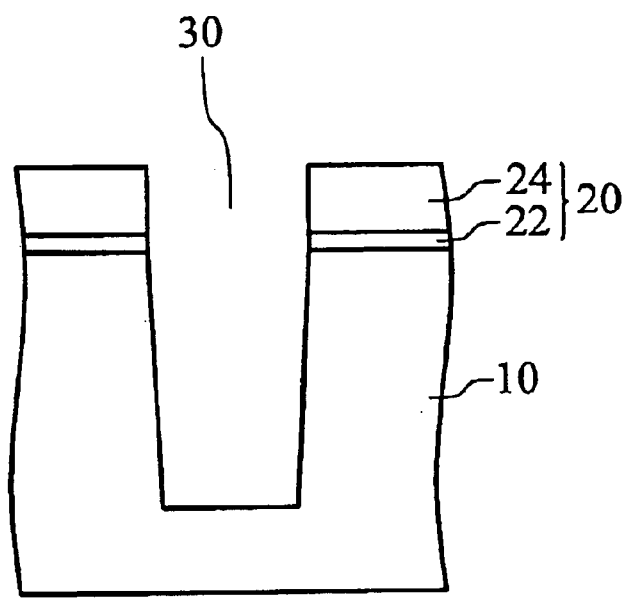
FIGS. 3–12 are cross-sections of an embodiment of the present invention for fabricating shallow trench isolation.

First, a mask layer 20 is formed on the substrate 10, and the thickness of the mask layer 20 is about 200~3500 Å. The mask layer 20 can be single- or multi-layered. As shown in FIG. 3, the mask layer consists of a pad oxide layer 22 and a silicon nitride layer 24. The pad oxide layer is formed using thermal oxidation, atmospheric pressure chemical vapor deposition (APCVD), or low pressure chemical vapor deposition (LPCVD). The silicon nitride layer 24 is formed using LPCVD, wherein $SiCl_2H_2$ and $NH_3$ are reactants. Next, a photo resistor (PR) (not shown in Fig.) defines the active region on the silicon nitride layer 24. The silicon nitride layer 24 and the pad oxide layer 22 are etched to expose the substrate 10. Thereafter, the exposed portion of the substrate 10 is etched to form a plurality of trenches 30, and the depth of the trench 30 is 5500~6500 Å.

Figure 4:
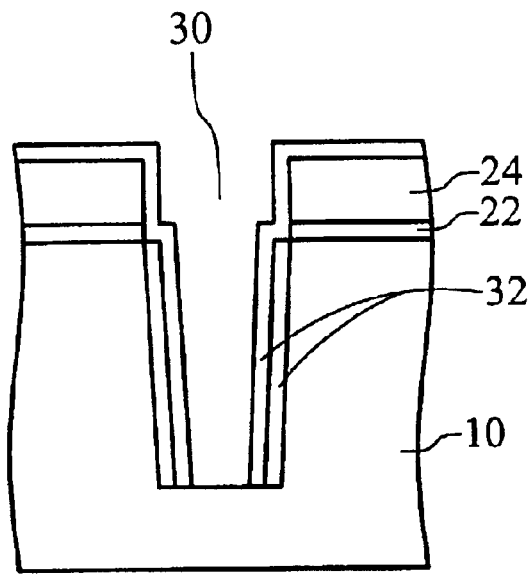

After forming the trench, as shown in FIG. 4, the PR (not shown) is removed, and a liner layer is formed on the sidewall of the trench 30. The liner layer is an insulating material, such as silicon nitride or silicon oxide, formed using LPCVD or PECVD 350 to 850° C. The thickness of the liner layer is about 200~2000 Å. In addition, the liner layer can be a composite structure of more than one insulating material. In this embodiment, the liner layer 32 consists of a silicon oxide layer and a silicon oxide layer, wherein the silicon oxide layer is formed on the sidewall of the trench 30, and the silicon nitride layer is deposited on the sidewall and the bottom of the trench. Then, the silicon nitride layer is etched using reaction ion etching (RIE), wherein SF6, CF4, CHF3, or C2F6 is etchant. The composite liner layer 32 is formed thereafter.

Figure 5:
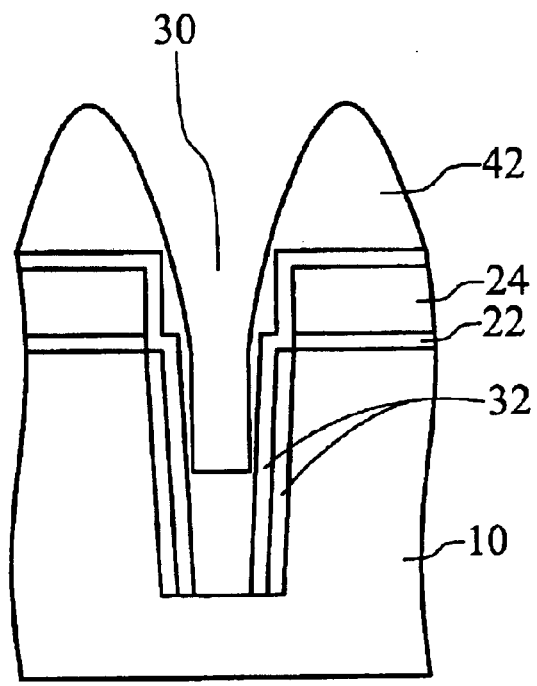
Figure 6:
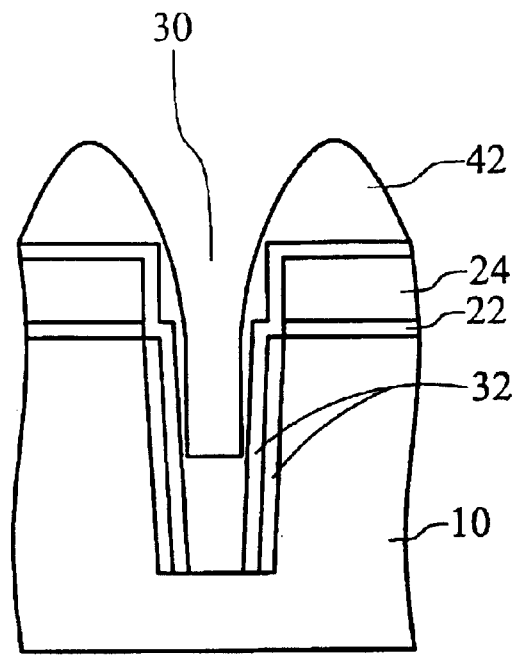

Next, as shown in FIG. 5, a dielectric layer 42 is deposited using HDPCVD on the substrate 10 and sequentially fills the trench 30. As a result, the dielectric layer 42 is deposited rapidly in vertical direction so that the opening of the trench 30 is almost sealed by the portion of dielectric layer 42 from the trench 30. As shown in FIG. 6, therefore, the portion of the dielectric layer 42 from the trench must be removed using chemical spray etching.

Figure 7:
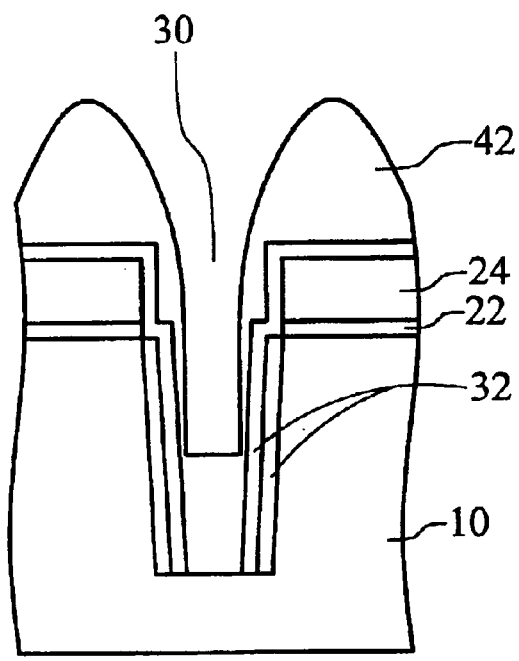

Next, repeating steps in FIGS. 5 and 6, the thickness of dielectric layer 42 in the trench 30 is increased, as shown in FIG. 7. In the embodiment, the dielectric layer 42 is silicon oxide and is deposited using HDPCVD, wherein O2 and SiH4 are reactants and Ar plasma sputters to form a silicon oxide layer with thickness about 2000~3000 Å.

Figure 8:
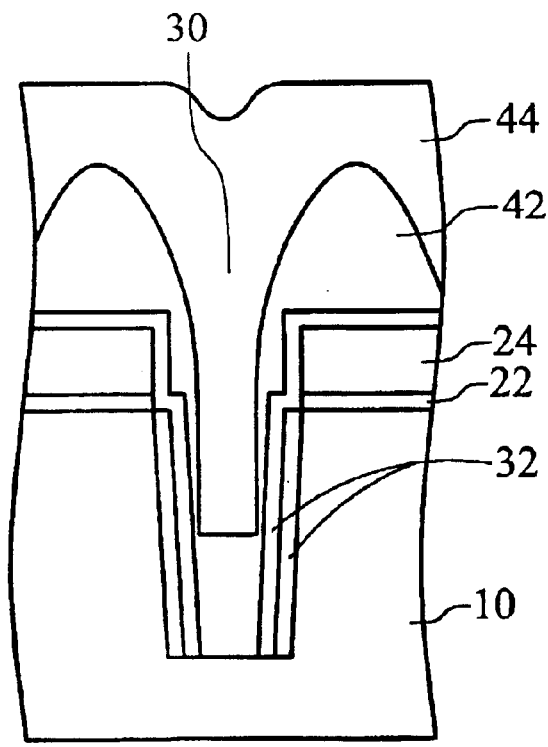

Because of the increased thickness of the dielectric layer 42, the portion of the dielectric layer 42 from the trench 30 also gets thicker, and the opening is almost sealed again. Indeed, the process described above can help reduce the aspect ration of the trench 30. When the aspect ratio is greater than 4, however, spray chemical etching is not effective to remove the portion of the dielectric layer 42 from the trench 30 before the open of the trench 30 sealed. A sacrificial layer 44 is therefore provided before the opening is sealed, as shown in FIG. 8. The sacrificial layer 44 is deposited on the substrate 10 using APCVD and made of BPSG. Due to the dielectric layer 42 deposited, the aspect ration of the trench 30 is reduced and the sacrificial layer fills the trench 30 easily and completely. In addition, the BPSG sacrificial layer 44 can be planarized to fill voids in the trench 30 using flow process.

Figure 9:
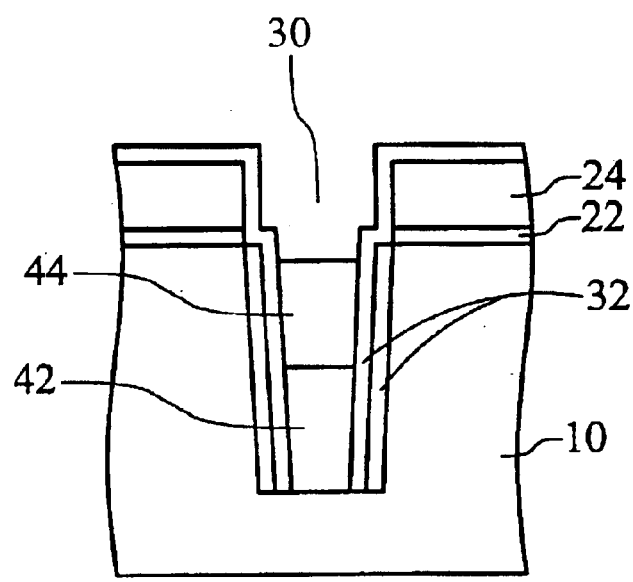

In FIG. 9, the sacrificial layer 44 and the dielectric layer 42 are partially removed using wet etching, and the sacrificial layer 44 and the dielectric layer 42 in the trench remain. For example, the dielectric layer 42 is silicon oxide and the sacrificial layer 44 is BPSG such that the BPSG layer remains in the trench 30 to protect the silicon oxide layer because of etching selectivity.

Figure 10:
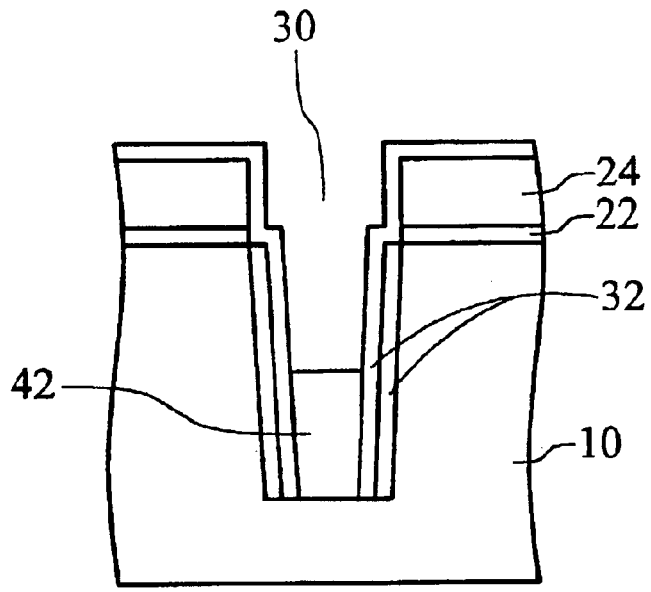

Afterwards, as shown in FIG. 10, the sacrificial layer 44 made of BPSG is completely removed using hydride fluorine vapor (VHF).

Figure 11:
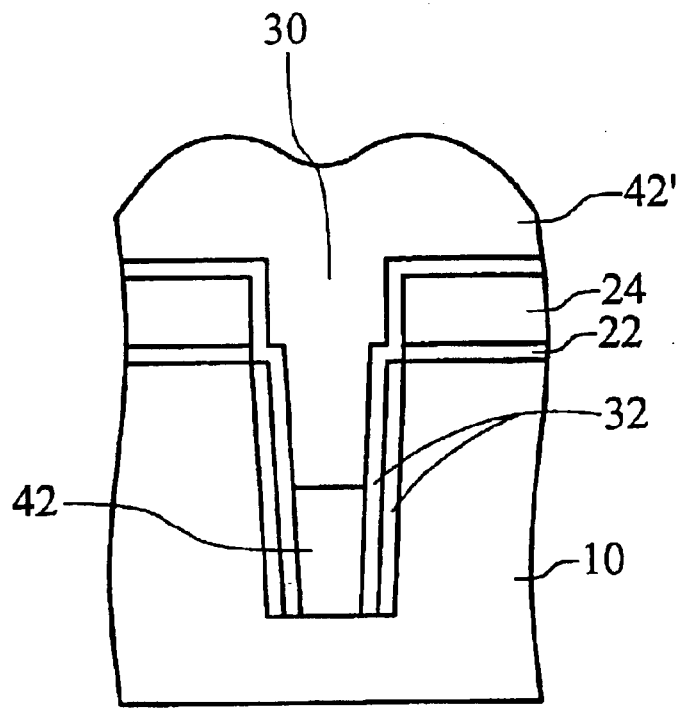

While the dielectric layer 42 only remains in the trench 30, the other dielectric layer 42' can be deposited on the substrate 10 and sequentially fill the trench 30, as shown in FIG. 11.

Figure 12:
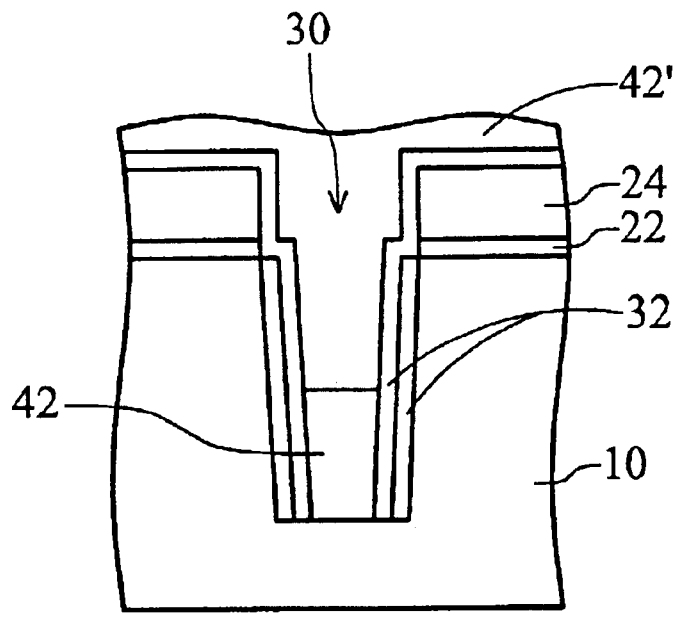

Finally, as shown in FIG. 12, the shallow trench isolation is completed by planarizing the dielectric layer 42', wherein the planarizing process uses etching or CMP.

According to the method described above, the trench having an aspect ratio greater than 6 can be filled by repeated HDPCVD through the steps in FIGS. 5~7.

Figure 13:
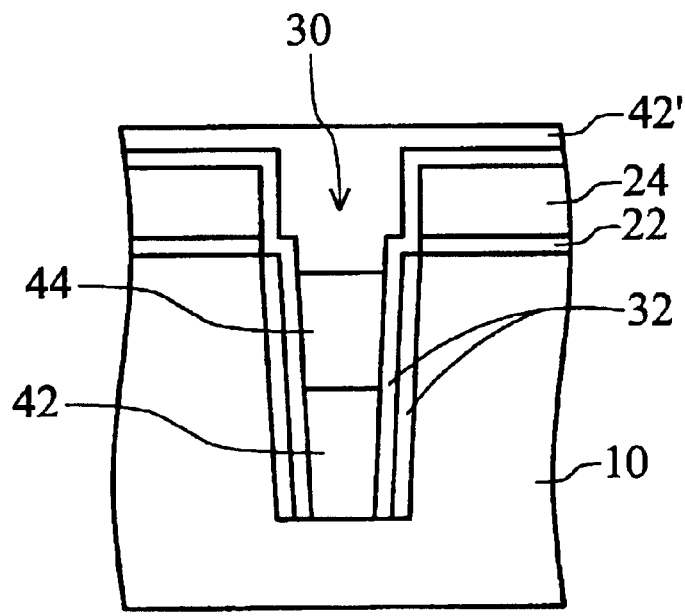
FIG. 13 is a cross-section of another embodiment of the present invention.

In another embodiment, as shown in FIG. 13, the sacrificial layer 44 made of BPSG need not be removed, because BPSG is also an insulating material. By skipping removal of the BPSG layer, subsequent HDPCVD is simplified, and the sacrificial layer 44 is covered by the dielectric layer 42' such that the sacrificial layer 44 is a portion of the dielectric layer for insulation.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). therefore the scope of the appended claims should be accorded the broadest interpretation so as to encompass all such modifications and similar arrangements.

What is claimed is:

1. A method for forming a shallow trench isolation, comprising:

providing a substrate;

forming a mask layer on the substrate;

etching the mask layer to expose a portion of the substrate;

etching a portion of the substrate to form a trench;

forming a liner layer on the inside wall of the trench;

sequentially depositing a first dielectric layer and a sacrificial layer on the substrate such that the trench is substantially filled, wherein the first dielectric layer is formed by high density plasma chemical vapor deposition (HDPCVD);

removing portions of the first dielectric layer and the sacrificial layer from the trench;

depositing a second dielectric layer on the substrate such that the trench is substantially filled, wherein the second dielectric layer is formed by high density plasma chemical vapor deposition (HDPCVD); and planarizing the second dielectric layer to remove a portion of the second dielectric layer from the trench.

2. The method as claimed in claim 1, wherein the mask layer comprises oxide.

3. The method as claimed in claim 1, wherein the mask layer comprises nitride.

4. The method as claimed in claim 1, wherein the liner layer comprises oxide.

5. The method as claimed in claim 1, wherein the liner layer comprises nitride.

6. The method as claimed in claim 1, wherein the first dielectric layer comprises oxide.

7. The method as claimed in claim 1 further comprising completely removing the sacrificial layer before depositing the second dielectric layer.

8. The method as claimed in claim 1, wherein the sacrificial layer is boron-doped phosphosilicate glass (BPSG).

9. The method as claimed in claim 8, further comprising a flow process for planarizing and filling voids in the trench after the boron-doped phosphosilicate glass layer is deposited.

10. The method as claimed in claim 8, further comprising completely removing the boron-doped phosphosilicate glass layer before depositing the second dielectric layer.

11. The method as claimed in claim 10, wherein the boron-doped phosphosilicate glass layer is removed using hydride fluorine vapor (VHF).

12. The method as claimed in claim 1, wherein depth of the trench is about 5500~6500 Å.

13. The method as claimed in claim 1, wherein the second dielectric layer comprises oxide.

14. The method as claimed in claim 1, wherein the second dielectric layer is planared by chemical mechanical polishing (CMP).

15. The methods as claimed in claim 1, wherein the second dielectric layer is planared by etching.

16. The method as claimed in claim 1 further comprising spray chemical etching.

17. A method for forming a shallow trench isolation, comprising:
   providing a substrate;
   forming a mask layer on the substrate;
   etching the mask layer to expose a portion of the substrate;
   etching the portion of the substrate to form a trench;
   forming a liner layer on the inside wall of the trench;
   sequentially depositing a first dielectric layer and a boron-doped phosphosilicate glass layer on the substrate such that the trench is substantially filled, wherein the first dielectric layer is formed by high density plasma chemical vapor deposition (HDPCVD);
   depositing the boron-doped phosphosilicate glass layer to planarize and fill voids in the trench;
   removing portions of the first dielectric layer and the boron-doped phosphosilicate glass layer from the trench;
   depositing a second dielectric layer on the substrate such that the trench is substantially filled, wherein the second dielectric layer is formed by high density plasma chemical vapor deposition (HDPCVD); and
   planarizing the second dielectric layer to remove a portion of the second dielectric layer from the trench using chemical mechanical polishing (CMP) process.

18. The method as claimed in claim 17, wherein the mask layer comprises oxide.

19. The method as claimed in claim 17, wherein the mask layer comprises nitride.

20. The method as claimed in claim 17, wherein the liner layer comprises oxide.

21. The method as claimed in claim 17, wherein the liner layer comprises nitride.

22. The method as claimed in claim 17, wherein the first dielectric layer comprises oxide.

23. The method as claimed in claim 17 further comprising completely removing the boron-doped phosphosilicate glass layer before depositing the second dielectric layer.

24. The method as claimed in claim 23, wherein the boron-doped phosphosilicate glass layer is removed by hydride fluorine vapor.

25. The method as claimed in claim 17, wherein depth of the trench is about 5500~6500 Å.

26. The method as claimed in claim 17, wherein the second dielectric layer comprises oxide.

27. The method as claimed in claim 17 further comprising spray chemical etching.

* * * * *